United States Patent [19]

Stempin et al.

[11] Patent Number: 4,536,452
[45] Date of Patent: Aug. 20, 1985

[54] SPONTANEOUSLY-FORMED MACHINABLE GLASS-CERAMICS

[75] Inventors: John L. Stempin, Beaver Dams; Dale R. Wexell, Corning, both of N.Y.

[73] Assignee: Corning Glass Works, Corning, N.Y.

[21] Appl. No.: 544,841

[22] Filed: Oct. 24, 1983

[51] Int. Cl.³ .................................. B32B 15/04
[52] U.S. Cl. .................................. 428/433; 428/696; 428/697; 501/57; 501/68; 501/73
[58] Field of Search ............ 428/433, 696, 697; 501/5, 9, 57, 68, 73

[56] References Cited

U.S. PATENT DOCUMENTS

| | | | |
|---|---|---|---|
| 2,920,971 | 1/1960 | Stookey | 65/33 |
| 3,149,947 | 9/1964 | Eppler et al. | 65/33 |
| 3,732,087 | 5/1973 | Grossman | 65/33 |
| 3,756,838 | 5/1971 | Beall | 501/3 |
| 3,798,114 | 3/1974 | Chvatel | 428/433 |
| 3,985,534 | 10/1976 | Flannery et al. | 65/33 |
| 3,997,352 | 12/1976 | Beall | 501/3 |
| 4,414,281 | 11/1983 | Hoda | 428/433 |
| 4,473,653 | 9/1984 | Rudoi | 501/5 |

FOREIGN PATENT DOCUMENTS 0154480 3/1982 Fed. Rep. of Germany.

Primary Examiner—George F. Lesmes
Assistant Examiner—William M. Atkinson
Attorney, Agent, or Firm—C. S. Janes, Jr.

[57] ABSTRACT

This invention is related to the production of machinable glass-ceramic articles which are essentially free from crystals having a mica structure and consist essentially, in weight percent, of $SiO_2$: 24–28
$Al_2O_3$: 9–20
MgO: 12–28
SrO: 0–11
BaO: 0–14
CuO: 0–5
$Ag_2O$: 0–3.5
NiO: 0–1.5
$Cr_2O_3$: 0.5–6.5
F: 2–9

2 Claims, No Drawings

SPONTANEOUSLY-FORMED MACHINABLE GLASS-CERAMICS

BACKGROUND OF THE INVENTION

Conventional glass-ceramic articles were first disclosed in U.S. Pat. No. 2,920,971. As described therein, such articles are prepared by following three general steps: first, a glass forming batch normally containing a nucleating agent is melted; second, that melt is simultaneously cooled to a temperature at least below the transformation range thereof and a glass article of a desired geometry shaped therefrom; and third, that glass article is subjected to a heat treatment to effect crystallization in situ. That heat treatment is frequently conducted in two stages; viz., the glass article is initially heated to a temperature in the vicinity of or slightly above the transformation range to cause the development of nuclei therein, and thereafter the nucleated glass is heated to a temperature approaching or exceeding the softening point of the glass to promote the growth of crystals on those nuclei. That patent is incorporated herein by reference for its general discussion of the nature and production of conventional glass-ceramic articles.

There is no mention in that patent of glass-ceramics which are capable of being machined with common hand tools. Thus, conventional glass-ceramic articles tend to be brittle and to shutter when subjected to standard machining processes.

However, U.S. Pat. No. 3,689,293 disclosed compositions within the $K_2O$—$MgO$—$Al_2O_3$—$B_2O_3$—$SiO_2$—F system capable of forming machinable glass-ceramics due to the presence of fluormica crystals therein having a structure related to the natural mineral phlogopite. Other U.S. patents describing the preparation of machinable glass-ceramic articles include U.S. Pat. Nos. 3,732,087, 3,756,838, 3,801,295, and 3,997,352. Each of those patents discloses products containing a fluormica as the predominant crystal phase.

Spontaneously-formed glass-ceramic articles are described in several U.S. patents such as U.S. Pat. Nos. 3,985,531, 3,985,532, 3,985,533, 4,239,520, and 4,244,723. The method for producing such articles contemplates four general steps: a batch of the proper composition is melted; that melt is simultaneously cooled to a temperature about 100°–300° C. above the annealing point of the glass to develop phase separation and nucleation therein and a glass body of a desired configuration shaped therefrom; that glass body is exposed to a temperature between the annealing point of the glass and the temperature of phase separation and nucleation to cause crystallization on the nuclei; and the crystallized body is cooled to room temperature. Because the compositions crystallize so rapidly, the times of exposures to Steps 2 and 3 may be relatively brief. No further heat treatment is necessary.

U.S. Pat. No. 4,239,520 discloses the preparation of spontaneously-formed, machinable glass-ceramic bodies containing fluormica as the predominant crystal phase from compositions consisting essentially, in weight percent, of 6–11% $K_2O$, 1.7–4% $Li_2O$, 17–25% MgO, 50–65% $SiO_2$ and 5–8.5% F.

SUMMARY OF THE INVENTION

The instant invention is concerned with the production of spontaneously-formed, machinable glass-ceramic articles of high crystallinity, i.e., greater than 50% by volume, wherein the crystals are relatively uniformly-sized and are homogeneously dispersed within a minor amount of residual glassy matrix. The inventive articles are prepared through the crystallization of glass forming melts consisting essentially, expressed in terms of weight percent on the oxide basis, of about $SiO_2$: 24–48
$Al_2O_3$: 9–20
MgO: 12–28
SrO: 0–11
BaO: 0–14
CuO: 0–5
$Ag_2O$: 0–3.5
NiO: 0–1.5
$Cr_2O_3$: 0.5–6.5
F: 2–9

$Cr_2O_3$ is a vital component to insure articles of excellent machinability; i.e., the articles have the potential for being turned, shaped, planed, drilled, milled, or otherwise worked or fashioned by hand or machine-operated tools. The articles also exhibit excellent properties in terms of high resistivity and low loss tangent even at elevated temperatures.

In the absence of $Cr_2O_3$, the predominant crystal phase present in the glass-ceramic articles is a fluormica. X-ray diffraction analyses of the $Cr_2O_3$-containing articles, however, have failed to positively identify the crystal phases present, but such have definitely indicated the essential absence of any mica phase.

Under similar thermal conditions the size of the crystals developed in the inventive glass-ceramics decreases as the amount of $Cr_2O_3$ in the composition increases. Furthermore, the number of crystals present in the inventive articles increases as the $Cr_2O_3$ content is increased.

When the inventive $Cr_2O_3$-containing glass-ceramics are further heat treated in the manner described above with respect to the production of conventional glass-ceramic articles, they lose the characteristic of machinability.

In the absence of $Cr_2O_3$, the above-recited compositions can be crystallized in situ to form glass-ceramic articles wherein a fluormica constitutes the predominant crystal phase. Those articles exhibit some machinability, but far less than manifested by similar base compositions with at least 0.5% $Cr_2O_3$ therein.

Whereas NiO, $Ag_2O$, and CuO are not required components, their inclusion appears to contribute to enhanced machinability and higher resistivity in the final product. Furthermore, by subjecting the inventive CuO-containing articles to a heat treatment at temperatures between about 600°–900° C. in a reducing environment, an electrically-conductive, metallic copper surface layer can be developed thereon.

The method for producing the inventive glass-ceramics follows generally the procedure outlined above with respect to other spontaneously-formed glass-ceramic articles.

PRIOR ART

U.S. Pat. No. 3,146,114 discloses the use of 0.08–0.5 mole percent $Cr_2O_3$ as a nucleating agent to produce glass-ceramic articles containing nepheline as the predominant crystal phase. The base compositions for those products consist essentially, in mole percent, of 50–68% $SiO_2$, 16–34% $Al_2O_3$, 7–34% $Na_2O$, 0–15%

CaO, and 0–6% $K_2O$. There is no indication that the articles exhibit machinability.

U.S. Pat. No. 3,149,947 describes the preparation of machinable glass-ceramic articles employing 0.2–10% by weight $Cr_2O_3$ as a nucleating agent, wherein X-ray diffraction analyses have identified fluorophlogopite mica as comprising the predominant crystal phase.

West German Pat. No. 1,099,135 discusses the utility of 0.5–3% by weight $Cr_2O_3$ as a nucleating agent in producing glass-ceramic articles wherein spodumene, eucryptite, or cordierite constitutes the predominant crystal phase. There is no disclosure that the so-formed articles evidence machinability.

DESCRIPTION OF PREFERRED EMBODIMENTS

Table I outlines a spectrum of glass compositions, expressed in terms of parts by weight on the oxide basis, illustrating the parameters of the instant invention. Inasmuch as the sum of the individual constituents equals or closely approximates 100, for all practical purposes the values tabulated may be deemed to reflect weight percent. Furthermore, because it is not known with which cation(s) the fluoride is combined, it is merely reported as fluoride in accordance with conventional glass analysis practice. The actual batch ingredients may comprise any materials, either oxides or other compounds, which, when melted together, will be converted into the desired oxide in the proper proportion.

Glass forming batches of about one kilogram corresponding to the compositions of Table I were compounded, ballmilled together to obtain thorough mixing, and charged into silica crucibles. The crucibles were covered, introduced into an electrically-heated furnace, and the batches melted for about 2–4 hours at 1450° C. The melts were poured onto a steel plate, forming slabs having the approximate dimensions of 8"×8"×0.25", which were immediately transferred to annealers operating at about 500°–700° C. The resultant slabs were highly crystalline. In large commercial melting practice, a fining agent such as $As_2O_3$ may be included in customary amounts, if necessary, without adversely affecting the quality or properties of the glass-ceramic articles.

TABLE I

|  | 1 | 2 | 3 | 4 | 5 | 6 | 7 | 8 | 9 |
|---|---|---|---|---|---|---|---|---|---|
| $SiO_2$ | 32.6 | 24.1 | 39.7 | 37.5 | 31.4 | 31.2 | 30.0 | 30.4 | 31.5 |
| $Al_2O_3$ | 17.7 | 16.8 | 12.9 | 15.8 | 17.5 | 17.4 | 17.2 | 17.4 | 17.3 |
| MgO | 22.2 | 21.0 | 17.6 | 12.5 | 21.9 | 21.8 | 21.6 | 21.8 | 21.7 |
| SrO | 9.8 | 9.2 | 9.7 | 8.7 | 9.6 | 9.6 | 9.5 | 9.6 | 9.5 |
| BaO | 13.3 | 12.6 | 12.9 | 11.9 | 13.2 | 13.1 | 13.0 | 13.1 | 13.0 |
| F | 4.4 | 4.2 | 6.4 | 7.8 | 4.4 | 4.3 | 4.3 | 4.3 | 4.3 |
| $Cr_2O_3$ | — | 4.2 | 3.9 | 2.0 | 0.55 | 1.1 | 4.3 | 2.2 | 2.2 |
| CuO | — | 4.6 | — | — | 0.29 | — | — | — | 0.1 |
| $Ag_2O$ | — | 3.2 | — | 3.0 | 0.83 | 1.6 | — | — | 0.3 |
| NiO | — | — | — | 0.9 | 0.55 | — | — | 1.1 | 0.1 |

|  | 10 | 11 | 12 | 13 | 14 | 15 | 16 | 17 | 18 |
|---|---|---|---|---|---|---|---|---|---|
| $SiO_2$ | 32.0 | 31.3 | 29.8 | 31.5 | 32.3 | 40.4 | 27.2 | 30.7 | 39.2 |
| $Al_2O_3$ | 17.6 | 17.5 | 17.1 | 17.5 | 17.6 | 19.1 | 17.1 | 17.4 | 18.3 |
| MgO | 22.0 | 21.9 | 21.4 | 22.0 | 22.1 | 24.9 | 21.4 | 21.7 | 23.0 |
| SrO | 9.7 | 9.6 | 9.4 | 9.7 | 9.7 | 10.5 | 9.4 | 9.6 | — |
| BaO | 13.2 | 13.1 | 12.8 | 13.2 | 13.4 | — | 12.9 | 13.1 | 13.8 |
| F | 4.4 | 4.4 | 4.2 | 4.4 | 4.4 | 4.8 | 4.3 | 4.3 | 4.6 |
| $Cr_2O_3$ | 1.1 | 2.2 | 2.1 | 1.1 | 0.5 | 1.2 | 2.1 | 1.1 | 1.1 |
| CuO | — | — | — | 0.6 | — | — | 2.3 | — | — |
| $Ag_2O$ | — | — | 3.2 | — | — | — | — | 3.2 | 1.6 | — |
| NiO | — | — | — | — | — | — | — | 0.53 | — |

Table II provides a recital of various physical properties determined on the glass-ceramic slabs, as measured in accordance with conventional measuring techniques. Those determinations included modulus of rupture (MOR), measured in terms of psi on abraded samples; coefficient of thermal expansion (Coef. Exp.) over the range 25°–300° C. in terms of x $10^{-7}/°C$.; electrical resistivity (Log $\rho$) measured at 250° C. and 350° C. in terms of ohm-cm; dielectric constant (D.C.) measured at 24° C. at 1 KHz; and loss tangent (L.T.) measured at 24° C. at 1 KHz. Table II also reports a qualitative comparison of machinability based upon behavior when subjected to hacksaws and steel drills. The machinability index (M.I.) employed utilized cold rolled steel, aluminum, and brass with indices of 78, 32, and 15, respectively.

TABLE II

|  | 1 | 2 | 3 | 4 | 5 |
|---|---|---|---|---|---|
| MOR | 7,746 | 6,758 | 13,993 | 11,212 | 14,800 |
| Coef. Exp. | 60.7 | — | 69.2 | 71.5 | 66.2 |
| Log $\rho$ 250 | 15.83 | — | 11.59 | 10.84 | 13.64 |
| Log $\rho$ 350 | 13.25 | — | 9.99 | 9.26 | 11.70 |
| D.C. | 7.7 | — | 6.62 | 7.25 | 7.19 |
| L.T. | 0.001 | — | 0.007 | 0.004 | 0.001 |
| M.I. | 30 | 20 | 30 | 30 | 55 |

|  | 6 | 7 | 8 | 9 | 10 |
|---|---|---|---|---|---|
| MOR | 12,420 | 13,850 | 15,340 | 9,452 | 16,340 |
| Coef. Exp. | 71.8 | 67.5 | 71.4 | 60.8 | 68.1 |
| Log $\rho$ 250 | 14.06 | 14.23 | 14.81 | 16.11 | 13.99 |
| Log $\rho$ 350 | 12.05 | 12.18 | 12.72 | 13.31 | 12.17 |
| D.C. | 5.58 | 7.91 | 7.23 | 7.46 | 7.10 |
| L.T. | 0.014 | 0.041 | 0.0000 | 0.003 | 0.007 |
| M.I. | 20 | 20 | 30 | 5 | 30 |

|  | 11 | 12 | 13 | 14 | 15 |
|---|---|---|---|---|---|
| MOR | 10,800 | 12,300 | 14,880 | 10,244 | 12,018 |
| Coef. Exp. | — | 73.1 | 70.1 | 63.4 | 55.7 |
| Log $\rho$ 250 | 15.13 | 14.77 | 14.26 | 14.25 | 15.32 |
| Log $\rho$ 350 | 12.90 | 12.48 | 12.22 | 12.24 | 12.90 |
| D.C. | 7.1 | 7.7 | 6.21 | 7.26 | 7.01 |
| L.T. | 0.010 | 0.004 | 0.002 | 0.002 | 0.001 |
| M.I. | — | 10 | 30 | 20 | — |

|  | 16 | 17 | 18 |
|---|---|---|---|
| MOR | 18,940 | 17,600 | 10,889 |
| Coef. Exp. | — | 70.6 | — |
| Log $\rho$ 250 | — | 14.51 | — |
| Log $\rho$ 350 | — | 12.47 | — |
| D.C. | — | 7.17 | — |
| L.T. | — | 0.002 | — |
| M.I. | 20 | 30 | 20 |

A comparison of Example 1, containing no $Cr_2O_3$, with the other exemplary compositions clearly illustrates the dramatic effect which the inclusion of $Cr_2O_3$ can have upon the mechanical strength and the machinability of the crystallized product. X-ray diffraction analysis of glass-ceramic Example 1 manifested the presence of fluormica as the predominant crystal phase, whereas like analyses conducted on the other glass-ceramics of Table I could not positively identify the crystal phases present. X-ray dispersion analyses of several of the recited glass-ceramics indicated that the crystals are high in barium, magnesium, and silica contents, but the exact levels of other components could not be determined. A chromium oxide-containing species was also observed to be present, but its identification could not be definitely established.

Where desired, those glass-ceramics containing CuO may be fired in a reducing atmosphere at temperatures between about 600°–900° C. to cause the formation of a conductive metallic surface layer on the article for such applications as printed circuit boards. As a matter of efficiency and speed in operation, hydrogen will comprise the heat treating atmosphere. Nevertheless, known conventional reducing environments such as cracked ammonia, forming gas, etc., are also operable. Such treatment, however, appears to reduce the machinability character of the glass-ceramic.

Conductive metallic copper surface layers are readily developed on the pristine or as-formed glass-ceramic bodies. When that layer is removed, however, subsequent heat treatment in a reducing environment yields only a thin, discontinuous metallic copper surface which is scarcely-conductive, if at all. The mechanism underlying that phenomenon has been postulated as follows. When the pristine or as-formed crystallized surface of the glass-ceramic body is subjected to a heat treatment in a reducing environment, migration of copper ions to the surface so depletes the copper content in the interior of the body that sufficient copper is not available for further migration, except for very long, economically-unattractive heat treatments, e.g., 48–96 hours.

Examples 1, 3, 5, 6, 9, 13, and 17 were subjected to the following heat treatment schedule designed to produce fluormica-containing glass-ceramic articles:
Heat at 400° C./hour to 800° C.;
Hold at 800° C. for two hours;
Heat at 400° C./hour to 1100° C.;
Hold at 1100° C. for six hours;
Cool to room temperature at furnace rate.

The resulting fluormica-containing bodies demonstrated severely reduced machinability characteristics, since all the bodies chipped or cracked when subjected to drilling or sawing with stainless steel tools. The articles could only be drilled with a high speed carbide drill bit. The machinability index of the heat treated articles had declined to an average value of ~70.

Example 9 demonstrated the best electrical properties in terms of high resistivity and low loss tangent even at elevated temperatures. Example 8, however, is deemed to constitute the most preferred composition when all of the physical characteristics thereof are considered.

We claim:

1. A machinable glass-ceramic article having a crystal content greater than 50% by volume and being essentially free from any mica phase consisting essentially, in weight percent on the oxide basis (fluorine being reported as fluoride), of:
$SiO_2$: 24–48
$Al_2O_3$: 9–20
MgO: 12–28
SrO: 8.7–11
BaO: 1.9–14
CuO: 0–5
$Ag_2O$: 0–3.5
NiO: 0–1.5
$Cr_2O_3$: 0.5–6.5
F: 2–9.

2. A machinable glass-ceramic article according to claim 1 having a metallic surface layer thereon consisting of copper.

* * * * *

UNITED STATES PATENT AND TRADEMARK OFFICE
CERTIFICATE OF CORRECTION

PATENT NO. : 4,536,452

DATED : August 20, 1985

INVENTOR(S) : John L. Stempin and Dale R. Wexell

It is certified that error appears in the above-identified patent and that said Letters Patent is hereby corrected as shown below:

Column 6, line 21, "BaO: 1.9-14" should read --BaO: 11.9-14--.

Signed and Sealed this

Third Day of December 1985

[SEAL]

Attest:

DONALD J. QUIGG

Attesting Officer

Commissioner of Patents and Trademarks